(12) United States Patent
Seler et al.

(10) Patent No.: US 9,653,426 B2
(45) Date of Patent: May 16, 2017

(54) METHOD OF MANUFACTURING A SEMICONDUCTOR PACKAGE HAVING AN INTEGRATED MICROWAVE COMPONENT

(71) Applicant: Infineon Technologies AG, Neubiberg (DE)

(72) Inventors: Ernst Seler, Munich (DE); Maciej Wojnowski, Munich (DE); Walter Hartner, Bad Abbach (DE); Josef Boeck, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/146,090

(22) Filed: May 4, 2016

(65) Prior Publication Data

US 2016/0247780 A1      Aug. 25, 2016

Related U.S. Application Data

(62) Division of application No. 14/106,092, filed on Dec. 13, 2013, now Pat. No. 9,337,159.

(51) Int. Cl.
*H01L 23/00* (2006.01)
*H01L 21/56* (2006.01)
(Continued)

(52) U.S. Cl.
CPC ............ *H01L 24/96* (2013.01); *H01L 21/561* (2013.01); *H01L 21/568* (2013.01);
(Continued)

(58) Field of Classification Search
CPC ............ H01L 21/56; H01L 2924/1423; H01L 2223/6683; H01L 23/66
See application file for complete search history.

(56) References Cited

U.S. PATENT DOCUMENTS 7,372,408 B2    5/2008   Gaucher et al.
2009/0125772 A1*  5/2009   Yin .................. H03B 19/14
                                                714/738
(Continued)

FOREIGN PATENT DOCUMENTS

CN        102130088 A    7/2011
CN        102786024 A    11/2012

OTHER PUBLICATIONS

Bozzi, M. et al., "Review of substrate-integrated waveguide circuits and antennas", IET Microwaves, Antennas & Propagation, vol. 5, Issue 8, 2011, pp. 909-920.
(Continued)

*Primary Examiner* — Peniel M Gumedzoe
(74) *Attorney, Agent, or Firm* — Murphy, Bilak & Homiller, PLLC

(57) ABSTRACT

A method of manufacturing an array of semiconductor device packages includes placing a plurality of semiconductor chips on a temporary carrier, covering the plurality of semiconductor chips with an encapsulation material to form an encapsulation body, providing a plurality of microwave components each including at least one electrically conducting wall structure integrated in the encapsulation body, forming a plurality of electrical interconnects each configured to electrically couple a semiconductor chip and a microwave component, and separating the encapsulation body into single semiconductor device packages each including a semiconductor chip, a microwave component and an electrical interconnect.

7 Claims, 7 Drawing Sheets

(51) Int. Cl.
*H01L 23/31* (2006.01)
*H01L 23/66* (2006.01)

(52) U.S. Cl.
CPC .......... *H01L 23/3128* (2013.01); *H01L 23/66* (2013.01); *H01L 24/19* (2013.01); *H01L 2924/12042* (2013.01); *H01L 2924/19105* (2013.01)

(56) References Cited

U.S. PATENT DOCUMENTS

2012/0049375 A1* 3/2012 Meyer .................. H01L 21/568
257/773
2014/0110841 A1 4/2014 Beer et al.

OTHER PUBLICATIONS

Kim, Dong-Yeon et al., "Design of SIW Cavity-Backed Circular-Polarized Antennas Using Two Different Feeding Transitions", IEEE Transactions on Antennas and Propagation, vol. 59, No. 4, Apr. 2011, pp. 1398-1403.
Li, Rui et al., "Embedded Wafer Level Packaging for 77-GHz Automotive Radar Front-End With Through Silicon Via and its 3-D Integration", IEEE Transactions on Components, Packaging and Manufacturing Technology, vol. 3, No. 9, Sep. 2013, pp. 1481-1488.
Shen, Wei et al., "Compact Substrate Integrated Waveguide (SIW) Transversal Filter with Triple-Mode Microstrip Resonator", Proceedings of Asia-Pacific Microwave Conference, IEICE, 2010, pp. 1875-1878.

* cited by examiner

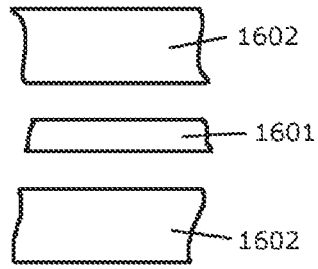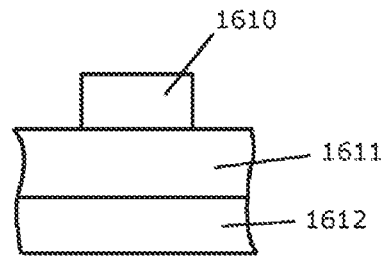
Fig. 16A            Fig. 16B
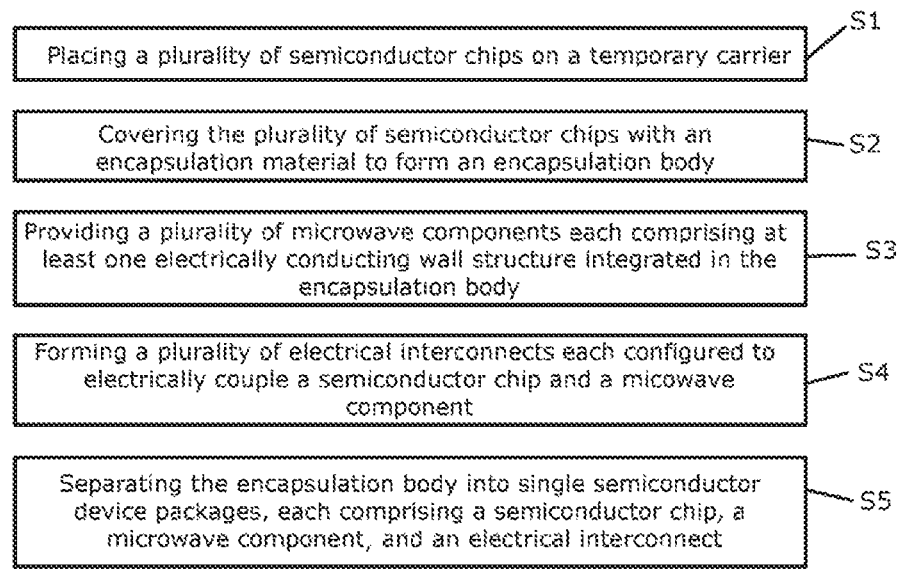
Fig. 17

METHOD OF MANUFACTURING A SEMICONDUCTOR PACKAGE HAVING AN INTEGRATED MICROWAVE COMPONENT

TECHNICAL FIELD

This invention relates generally to the technique of semiconductor device packaging, and in particular to the technique of embedding a semiconductor chip and components into an encapsulant.

BACKGROUND

Semiconductor device manufacturers are constantly striving to increase the performance of their products, while decreasing their cost of manufacture. A cost intensive area in the manufacture of semiconductor device packages is packaging the semiconductor chip. Thus, semiconductor device packages and methods of manufacturing the same at low expenses and high yield are desirable. Further, the constant effort to provide semiconductor device packages which are smaller, thinner, or lighter and with more diverse functionality and improved reliability has driven a stream of technological innovations in all technical fields involved.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 16A and 16B schematically illustrate a plan view of a coplanar line and a cross-sectional view of a microstrip line, respectively, for conveying microwave frequency signals.

FIG. 17 is a flowchart of an exemplary process for manufacturing a semiconductor device package including a semiconductor chip and a rectangular waveguide by using embedded wafer level packaging (eWLP) technology.

DETAILED DESCRIPTION

Figure 1:
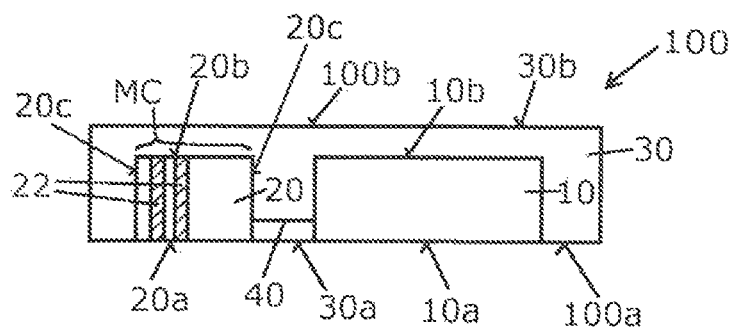
FIG. 1 schematically illustrates a cross-sectional view of an exemplary semiconductor device package including a semiconductor chip and a microwave component.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a material layer formed or located "over" a surface may be used herein to mean that the material layer be located (e.g. formed, deposited, etc.) "directly on", e.g. in direct contact with, the implied surface. The word "over" used with regard to a material layer formed or located "over" a surface may be used herein to mean that the material layer be located (e.g. formed, deposited, etc.) "indirectly on" the implied surface with one or more additional layers being arranged between the implied surface and the material layer.

The semiconductor device packages described herein may contain one or more semiconductor chips. The semiconductor packages described further below may contain semiconductor chip(s) of different types, may be manufactured by different technologies and may include, for example, integrated circuits, e.g., monolithic integrated electrical, electro-optical, electro-mechanical circuits, organic substrate, anorganic substrate, miniaturized electronic packages and/or passives. More specifically, the semiconductor chip(s) may include logic integrated circuits, analogue integrated circuits, mixed signal integrated circuits, power integrated circuits, memory circuits, or integrated passive devices (IPD).

The semiconductor chip(s) described herein may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors.

The semiconductor chip(s) described herein may include control circuits, microprocessors, memory circuits and/or micro-electromechanical components. They may e.g. include transmitters, receivers, transceivers, sensors, or detectors. In particular, the semiconductor chip(s) described herein may include wireless components such as, e.g., microwave circuitry, e.g. microwave transmitters, receivers, transceivers, sensors, or detectors. By way of example, the semiconductor chip(s) described herein may include integrated microwave circuitry operating in the frequency range between, e.g., 20 and 200 GHz, more particularly in the frequency range between 40 and 160 GHz, e.g. at about 60, 80 or 120 GHz. Generally, the microwave frequency region ranges from about 300 MHz (wavelength of about 1 meter) to about 300 GHz (wavelength of about 1 mm).

Devices containing semiconductor chip(s) having a horizontal structure may be involved. A semiconductor chip having a horizontal structure may have chip electrodes only on one of its two main surfaces, e.g. on its active surface.

The chip electrodes (or contact pads) allow electrical contact to be made with the integrated circuit(s) (e.g. microwave transmitter/receiver circuitry, controller circuitry, etc.) included in the semiconductor chip(s). The chip electrodes, e.g. I/O electrodes, ground electrodes, power supply electrodes, microwave frequency electrodes, control electrodes, etc., may include one or more electrode metal layers that are applied to the semiconductor material.

The semiconductor device package described herein includes a microwave component, i.e. is a "microwave component-in-package" module. The microwave component may operate in one or more of the above-mentioned frequency ranges. The microwave component comprises an electrically conducting wall structure integrated in an encapsulant. The electrically conducting wall structure may form part of a microwave device such as, e.g., a microwave filter, a microwave antenna, a microwave antenna array, a microwave resonator, a microwave power combiner, a microwave power divider, or an electromagnetic shielding, e.g. an electromagnetic shielding for increasing the isolation between signal paths. By way of example, the microwave component may comprise or be a rectangular waveguide integrated in the encapsulant, i.e. a "rectangular waveguide-in-package" module.

The semiconductor device packages described herein comprise an encapsulating material forming the aforementioned encapsulant which embeds the semiconductor chip(s) and the electrically conducting wall structure of the microwave component (and possibly the entire microwave component).

The encapsulating material may be an electrically insulating material and may comprise or be a thermoset material or a thermoplastic material. A thermoset material may, e.g., be made on the basis of an epoxy resin, a silicone resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The encapsulating material may comprise or be a polymer material, e.g. a duroplastic polymer material. The encapsulating material may comprise or be at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

The encapsulating material may be applied over the semiconductor chips by embedding the semiconductor chips into the encapsulating material by, e.g., molding or laminating.

In the first case, i.e. if the encapsulating material is a mold material, various techniques such as, e.g., compression molding, injection molding, powder molding, or liquid molding may be used to form an encapsulant or an encapsulation body containing a plurality of encapsulants. The mold material may be applied to overmold the semiconductor chips and a temporary carrier on which the semiconductor chips may be placed.

In the second case, i.e. if the encapsulating material is made of a laminate material, the encapsulating material may have the shape of a piece of a layer, e.g. a piece of a sheet or foil that is laminated over the semiconductor chips and over a temporary carrier on which the semiconductor chips are placed. Heat and pressure may be applied for a time suitable to attach the piece of a foil or sheet to the underlying structure. During lamination, the electrically insulating foil or sheet is capable of flowing (i.e. is in a plastic state), resulting in that gaps between the semiconductor chips and/or other topological structures (such as, e.g., microwave component inserts) on the carrier are filled with the polymer material of the electrically insulating foil or sheet. The electrically insulating foil or sheet may comprise or be any appropriate thermoplastic or thermoset material. In various embodiments, the insulating foil or sheet may comprise or be a prepreg (short for pre-impregnated fibers), that is e.g.

made of a combination of a fiber mat, for example glass or carbon fibers, and a resin, for example a thermoset or thermoplastic material. Prepreg materials are typically used to manufacture PCBs (printed circuit boards).

The encapsulant (or, if manufactured by eWLP techniques, the encapsulation body of which the encapsulant is cut out) may have a (bottom) first main surface which may partly or completely be covered by an electrical redistribution layer (RDL). The RDL may be electrically connected to the chip electrode(s). The RDL may include one or more metallization layers. The one or more metallization layers may serve as an electrical interconnect which is configured to electrically connect the microwave component to the semiconductor chip(s). To this end, by way of example, the RDL may be structured to include microwave transmission lines such as, e.g., coplanar lines or microstrip lines. Further, the RDL may be structured to form a first metal plate of the microwave component such as, e.g., a rectangular waveguide embedded in the encapsulant.

The encapsulant (or, if manufactured by eWLP techniques, the encapsulation body) may have a second main surface which may be at least partly covered by one or more metal layers. The metal layer may, e.g., be structured to form a second metal plate of the microwave component, that is, e.g., of a rectangular waveguide embedded in the encapsulant. The metal layer may, e.g., cover a part or all of the second main surface of the encapsulant (or of the encapsulation body). Any desired metal, for example, aluminum, titanium, gold, silver, copper, palladium, platinum, nickel, chromium, or nickel vanadium, or metal alloys thereof may be used as the material. The metal layer may be but need not be homogenous or manufactured from just one material, that is to say various compositions and concentrations of the materials contained in the metal layer are possible.

The semiconductor device packages described herein may be used in various applications. By way of example, a semiconductor device package as described herein may be used for telecommunications, industrial, vehicular, scientific or medical purposes. In particular, it may be used in cordless phones, Bluetooth devices, near field communication (NFC) devices, motor vehicles, and wireless computer network. Such applications are, inter alia, covered by the ISM (industrial, scientific and medical) radio bands which are defined, inter alia, by the ITU-R in 5.138, 5.150, and 5.280 of the ITU Radio Regulations, which are incorporated herein by way of reference. For instance, ISM radio bands may be used at frequencies at about 24 GHz, 61 GHz, 80 GHz, and 122 GHz.

Further, semiconductor device packages as described herein may be used for radar (radio detection and ranging) applications. Radar semiconductor device packages are often used in automotive or industrial applications for range finding/range measuring systems. By way of example, vehicular automatic cruise control systems or vehicular anti-collision systems are operating in the microwave frequency region, e.g. at about 24 or 80 GHz. In all these applications it is important that packaging costs are minimized, reliability is high and performance (e.g. resolution, maximum distance measurement range) is high.

FIG. 1 illustrates an exemplary semiconductor device package 100. The semiconductor device package (or semiconductor module) 100 includes a semiconductor chip 10 and a microwave component (MC) 20. The semiconductor chip 10 and the microwave component 20 are, at least partly, embedded in an encapsulant 30. As will be described in more detail further below, the encapsulant 30 may, e.g., either be a mold material or a laminate.

The microwave component 20 and the semiconductor chip 10 may be electrically coupled to each other by an electrical interconnect 40, which is schematically depicted in FIG. 1. The electrical interconnect 40 may, e.g., be partly or completely embedded in the encapsulant 30. According to another possibility, as will be illustrated further below, the electrical interconnect 40 may be formed in an electrical redistribution layer (RDL) applied to a bottom (first) main surface 100a of the semiconductor device package 100.

As illustrated in FIG. 1, the semiconductor chip 10 may have a (bottom) first main surface 10a and a (top) second main surface 10b opposite to the first main surface 10a. The second main surface 10b and side faces 10c of the semiconductor chip 10 may be partly or completely covered by the encapsulant 30. The first main surface 10a may be exposed at the semiconductor device package 100, i.e. may not be covered by encapsulant 30. The first main surface 10a of the semiconductor chip 10 may, e.g., form the active surface of the semiconductor chip 10. Further, the first main surface 10a may be provided with the chip electrodes (not shown in FIG. 1) of the semiconductor chip 10.

The microwave component 20 may be located in the encapsulant 30 in a spaced-apart relationship to the semiconductor chip 10. According to one possibility, the microwave component 20 may be a pre-fabricated part or insert which may have been embedded in the encapsulant 30 by, e.g., using similar or the same techniques as for embedding the semiconductor chip 10 in the encapsulant 30. According to other possibilities, the microwave component 20 may be generated in the encapsulant 30 after forming (e.g. molding, laminating, etc.) the encapsulant 30. In this case, the microwave component 20 may be generated in the encapsulant 30 by using similar processes as employed for generating substrate integrated waveguide (SIW) components. By way of example, holes may be created in the encapsulant 30 by laser drilling or micro-drilling, and their metallization may be generated by using conductive paste or metal plating. Such techniques to implement a microwave component 20 in the encapsulant 30 allow for low manufacturing costs and great design flexibility.

The microwave component 20 may have a first (bottom) main surface 20a and a second (top) main surface 20b opposite to the first main surface 20a. In some embodiments, e.g. if the microwave component 20 is configured to establish a rectangular waveguide, the first main surface 20a and the second main surface 20b of the microwave component 20 may be formed by first and second metal plates (not shown in FIG. 1), respectively.

The second main surface 20b and side walls 20c of the microwave component 20 may be partly or completely embedded in the encapsulant 30. The first main surface 20a of the microwave component 20 may be exposed at the first main surface 100a of the semiconductor device package 100, i.e. may be uncovered by encapsulant 30. Further, as shown in FIG. 1, the first main surface 20a of the microwave component 20 and the first main surface 10a of the semiconductor chip 10 may be coplanar. That is, according to one possibility, the first main surfaces 10a, 20a of the semiconductor chip 10 and the microwave component 20, respectively, as well as a (bottom) surface 30a of the encapsulant may form a common bottom planar surface 100a of the semiconductor device package 100. Opposite thereto, a second main surface 100b of the semiconductor device package 100 may, e.g., be formed partly or completely by an (upper) second main surface 30b of the encapsulant 30.

It is to be noted that the microwave component 20 is a non-planar or three-dimensional (3D) structure. 3D microwave components 20, e.g. 3D rectangular waveguides, may exhibit high microwave propagation performance characteristics superior to the characteristics of planar 2D microwave components.

Further, it is to be noted that the package-integrated microwave component 20 allows for high design variability and high integration. Short distances between the semiconductor chip 10 and the microwave component 20 are feasible. That is, the electrical interconnect 40 used to electrically couple chip electrodes of the semiconductor chip 10 to a port of the microwave component 20 may have short length. By way of example, the length of the electrical interconnect 40 may be equal to or less than 2 mm, 1 mm, 0.5 mm, or 0.2 mm. The shorter the length of the electrical interconnect 40, the lower are the propagation losses of microwave transmission across the electrical interconnect 40. Further, by integrating the microwave component 20 in the encapsulant 30, it is possible to avoid microwave transmission over a chip-to-chip carrier interface and/or over a semiconductor device package-to-substrate interface (such as, e.g., a semiconductor device package-to-PCB (printed circuit board) interface). These interfaces are prone to losses and may also tend to lower reliability of the microwave devices. Further, the concept of package-integrated microwave components as described herein may obviate the need for package manufacturers and the customers to arrange for defined device package-to-substrate (e.g. application board, PCB) interfaces. In contrast, according to embodiments described herein, the main or entire microwave component 20 and/or microwave interconnect 40 functionalities may be implemented within the semiconductor device package 100. This allows for low-cost high performance devices with good testability.

Figure 2:
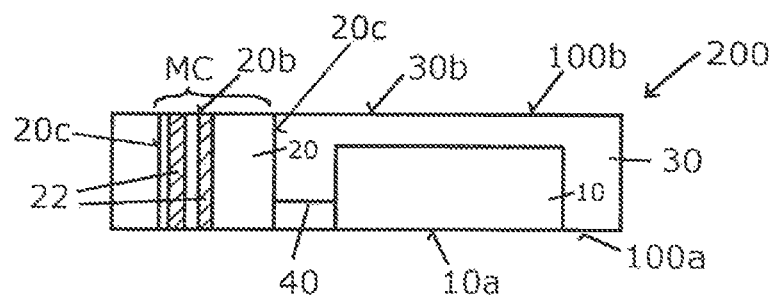
FIG. 2 schematically illustrates a cross-sectional view of an exemplary semiconductor device package including a semiconductor chip and a microwave component.

FIG. 2 illustrates an exemplary semiconductor device package 200. Semiconductor device package 200 may be identical to semiconductor package 100 except that the second main surface 20b of the microwave component (MC) 20 may be exposed at the (upper) second main surface 30b of the encapsulant 30. By way of example, the second main surface 20b of the microwave component 20 may be formed by a second metal plate (not illustrated). In this case, the second metal plate may be coplanar with and/or exposed at the second main surface 30b of the encapsulant 30.

Further, it is also possible that the second main surface 10b of the semiconductor chip 10 may be coplanar with and/or exposed at the second main surface 30b of the encapsulant 30. Exposure of the second main surface 10b of the semiconductor chip 10 at the upper surface 100b of the semiconductor device package 100 may, e.g., be provided by a grinding or lapping process applied to the encapsulant 30 in order to reduce the thickness of the encapsulant 30 and, e.g., the thickness of the semiconductor chip 10. In view of characteristics and features of the semiconductor device package 200, reference is made to the above disclosure to semiconductor device package 100 in order to avoid reiteration.

Figure 3:
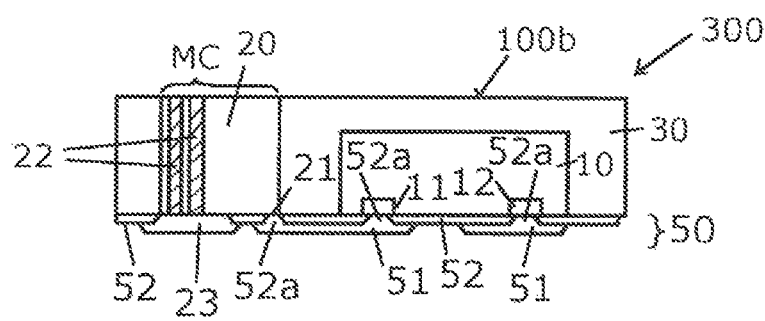
FIG. 3 schematically illustrates a cross-sectional view of an exemplary semiconductor device package including a semiconductor chip, a microwave component and an electrical redistribution layer (RDL).

FIG. 3 illustrates an exemplary semiconductor device package 300. The semiconductor device package 300 may be similar to the semiconductor device package 100 or—as illustrated by way of example in FIG. 3—to semiconductor device package 200. In semiconductor device package 300 the electrical interconnect 40 between the semiconductor chip 10 and the microwave component (MC) 20 is formed by an electrical redistribution layer (RDL).

More specifically, an electrical redistribution structure 50 may optionally be applied over the first main surface 100a comprising, e.g., the first main surface 10a of the semiconductor chip 10, the first main surface 20a of the microwave component 20 and the first main surface 30a of the encapsulant 30. The electrical redistribution structure 50 may, e.g., include one or more structured metallization layer(s) 51 and one or more structured dielectric (or insulating) layer(s) 52.

The dielectric (or insulating) layer 52 of the electrical redistribution structure 50 may include or be of a polymer material (e.g. polyimide, epoxy, silicone, etc.). The dielectric layer 52 may, e.g., be applied over the first surface 100a and may have openings 52a. The openings 52a may be aligned with electrodes 11, 12 of the semiconductor chip 10 and/or with a port 21 of the microwave component 20 and/or with a region of the microwave component 20 where a first metal plate 23 is located. The first metal plate 23 may, e.g., be formed by a structured part of the metallization layer 51 of the electrical redistribution structure 50.

The dielectric layer 52 is optional. Instead of the dielectric layer 52 or in addition thereto, a passivation layer (not shown) may be provided for an electric isolation of the semiconductor material from the environment. By way of example, such passivation layer may, e.g., be a hard passivation layer comprising an inorganic insulating material such as, e.g., silicon oxide, silicon nitride, etc. The dielectric layer(s) 52 may have a thickness of equal to or greater or less than 15 μm, 10 μm, 5 μm, or 2 μm.

The structured metallization layer 51 may be applied over the dielectric layer 52. The structured metallization layer 51 may include or be of a metal material such as, e.g., copper, aluminum, etc. The structured metallization layer 51 may be configured for ground, current, signal, power and/or microwave signal redistribution. In particular, the structured metallization layer 51 may form the electrical interconnect 40 configured to electrically couple the microwave component 20 to the semiconductor chip 10. In this respect, a microwave transmission line such as, e.g., a coplanar transmission line or a layer of a microstrip transmission line may be structured out of the metallization layer 51 to connect between chip electrode 11 (here used as a microwave signal electrode) and port 21 of the microwave component 20.

More specifically, the chip electrodes 11, 12 of the semiconductor chip 10 may be connected to conductive traces of the metallization layer 51. The conductive traces of the metallization layer 51 may, e.g., be configured to connect to external terminals (e.g. solder deposits) of the semiconductor device package 300 (such external terminals are not shown in FIG. 3 but may be directly applied to the metallization layer 51 of the redistribution structure 50). Further, as already mentioned above, such conductive traces of the metallization layer 51 may be used as the package-internal electrical interconnect 40 for microwave signal transmission.

It is to be noted that the electrical redistribution structure 50 may, e.g., include a multi-layer structure. That is, the electrical redistribution structure 50 may, e.g., include a plurality of metallization layers 51 and/or a plurality of dielectric (or insulating) layers 52. Generally, metallization layers 51 and dielectric layers 52 may be stacked one over the other in an alternating order and electrical through-connections (vias) may be provided to interconnect one structured part (e.g. a conducting trace) of one metallization layer with one other structured part (e.g. another conducting trace) of another metallization layer.

If a multi-layer redistribution structure 50 is provided, the electrical interconnect may use at least two metallization layers 51 separated by a dielectric layer 52. By way of example, a microstrip line may be fabricated in a multi-layer electrical redistribution structure 50. The metallization layer(s) 51 may have a thickness of equal to or greater or less than 15 μm, 10 μm, 5 μm, or 2 μm.

The microwave component 20 may include at least one electrically conducting wall structure 22. The electrically conducting wall structure 22 may extend in a vertical direction, i.e. rectangular to the first main surface 20*a* of the microwave component 20. The electrically conducting wall structure 22 causes the microwave component 20 to be a 3D structure. The electrically conducting wall structure 22 is integrated in the encapsulant 30. As mentioned above, integration in the encapsulant 30 may either be achieved by introducing the electrically conducting wall structure 22 directly into the encapsulant 30 or by pre-fabricating the microwave component 20 including the electrically conducting wall structure 22 and by embedding the pre-fabricated microwave component 20 as an insert in the encapsulant 30 (e.g. by over-molding or lamination).

Figure 4:
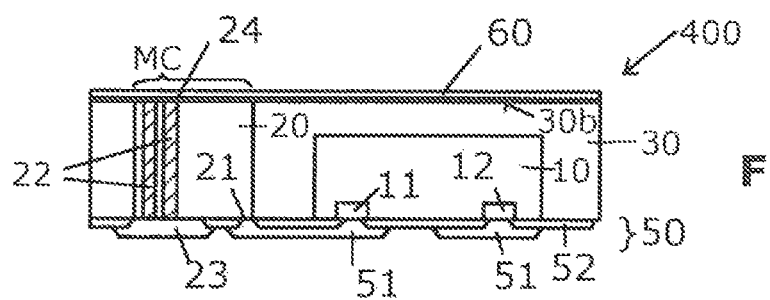
FIG. 4 schematically illustrates a cross-sectional view of an exemplary semiconductor device package including a semiconductor chip, a microwave component, an electrical redistribution layer (RDL) and an electrically conducting layer.

FIG. 4 illustrates an exemplary semiconductor device package 400. Semiconductor device package 400 is similar to semiconductor device package 300 except that an electrically conducting layer 60 is disposed over the second main surface 30*b* of the encapsulant 30. The electrically conducting layer 60 may be structured or may not be structured. By way of example, the electrically conducting layer 60 may cover the microwave component 20. By way of example, the microwave component 20 may comprise a second metal plate 24 provided at the top of the microwave component 20. The second metal plate 24 may be electrically connected to the at least one electrically conducting wall structure 22 of the microwave component 20. The second metal plate 24 of the microwave component 20 may, e.g., be structured out of the electrically conducting layer 60 to form an insular structure thereof or may be continuous with the electrically conducting layer 60. The electrically conducting layer 60 may, e.g., be formed on the second main surface 30*b* of the encapsulant 30 by a CVD (chemical vapor deposition) process, a PVD (physical vapor deposition) process, spraying, printing, a plasma-beam process, galvanic or electroless deposition, or sputtering.

The electrically conducting wall structure 22 may, e.g., electrically and/or mechanically be connected to the first metal plate 23 and/or the second metal plate 24. By way of example, the at least one electrically conducting wall structure 22 may comprise a row of conducting vias (so-called via fence), one or more conducting slots, or a conducting continuous wall. The row of conducting vias, one or more conducting slots, or the conducting continuous wall may either be formed directly in the encapsulant 30 or may be formed in and provided by a separate part (insert) embedded in the encapsulant 30. In the latter case, the electrically conducting wall structure 22 may be formed in the insert or on a wall of the insert. More specifically, the electrically conducting wall structure 22 of the microwave component 20 may, e.g., comprise a row of conducting vias formed in or on a wall of the insert material, one or more conducting slots formed in or on a wall of the insert material, or a continuous conducting wall formed on a wall of the insert material.

That is, the at least one electrically conducting wall structure 22 may, e.g., comprise a metallization on a wall, e.g. side wall, of the insert. In this case, the at least one electrically conducting wall structure 22 may be configured as a grid or mesh of conducting stripes formed on the wall of the insert. Further, the electrically conducting wall structure 22 may be formed as a continuous metallization on the wall of the insert. One or more of the side walls of the insert may be completely metallized in order to form the at least one electrically conducting wall structure 20.

It is to be noted if the at least one electrically conducting wall structure 22 is an "open structure" comprising, e.g., a row of conducting vias or one or more conducting slots, radiation losses should be kept reasonably small. By way of example, considering a row of conducting vias, the ratio s/d may be kept equal to or smaller than 3.0, 2.5, or 2.0, wherein s is the spacing between neighboring vias and d is the diameter of the vias.

It is to be noted that the various examples presented above to design a microwave component 20 and, in particular, an electrically conducting wall structure 22 thereof can be applied to all semiconductor device packages described herein. Further, it is to be noted that the at least one electrically conducting wall structure 22 is exemplified by two conducting vias in FIGS. 1 to 4 only for illustrative purposes. In general, a plurality of conducting vias, a plurality of conducting slots, or a continuous metallization could be used to establish the at least one electrically conducting wall structure 22. I The microwave component 20 may comprise a rectangular waveguide (or 3D waveguide). A rectangular waveguide may comprise the first metal plate 23 (e.g. formed by a structured part of the metallization layer 51 of the electrical redistribution structure 50), the second metal plate 24 (e.g. formed by a structured or unstructured part of the electrically conducting layer 60) and the at least one electrically conducting wall structure 22 connecting to the first metal plate 23 and to the second metal plate 24. By way of example, the first and second metal plates 23, 24 may be oriented parallel to each other and the at least one electrically conducting wall structure 22 may be oriented rectangular to the first and second metal plates 23, 24.

Figure 5A:
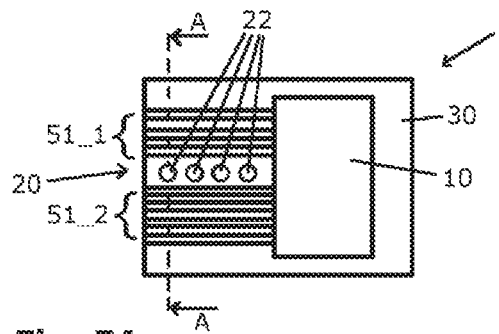
FIGS. 5A and 5B schematically illustrate a plan view and a sectional view along sectional line A-A of FIG. 5A, respectively, of an exemplary semiconductor device package.
Figure 5B:
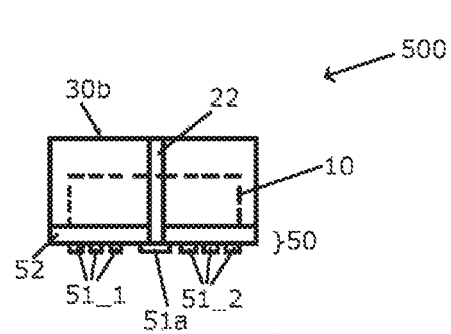

Referring to FIGS. 5A and 5B, a semiconductor device package 500 may comprise a semiconductor chip 10 and a microwave component embedded in the encapsulant 30. The microwave component 20 comprises a row of conducting vias forming an electrically conducting wall structure 22 which acts as an electromagnetic shielding. The semiconductor device package 500 may further comprise an electrical redistribution structure 50. The electrical redistribution structure 50 may be configured to form two microwave transmission lines 51_1 and 51_2. In the example of FIGS. 5A and 5B the two microwave transmission lines 51_1 and 51_2 are, by way of example, realized as coplanar waveguides (CPW). CPWs are microwave transmission lines consisting of a single conducting track and a pair of return conductors one to either side of the conducting track. Thus, a CPW may comprise three conductors (single conducting track and pair of return conductors) lying in the same plane. In the example of FIGS. 5A and 5B the two CPWs 51_1 and 51_2 are structured out of the metallization layer 51 of the electrical redistribution structure 50.

The electrically conducting wall structure 22 provides electromagnetic shielding between two microwave transmission lines, e.g. between CPWs 51_1 and 51_2. It is to be noted that the electrically conducting wall structure 22, which extends along the spacing between the two microwave transmission lines 51_1, 51_2, may also be realized by a continuous electrically conducting wall structure 22. The electrically conducting wall structure 22 may be electrically connected to the semiconductor chip 10 by a conductor trace 51*a*. The conductor trace 51*a* may be structured out of the metallization layer 51 and may be electrically insulated from the first microwave transmission line 51_1 and from the second microwave transmission line 51_2. The electrically conducting via (or, more generally, the electrically conducting wall structure 22) may extend from the conductor trace 51a up to the second main surface 30b of the encapsulant 30 or may be covered by a portion of the mold material or laminate material of the encapsulant 30.

FIGS. 6 to 14 illustrate various examples of other microwave components 20 which may be embedded in the semiconductor device packages described herein. It is to be noted that the microwave components 20 illustrated in FIGS. 6 to 14 are all of a rectangular waveguide design. That is, these microwave components 20 all comprise a (bottom) first metal plate 23, a (top) second metal plate 24 and the at least one electrically conducting wall structure 22 connected to both metal plates 23, 24. The metal plates 23, 24 may e.g. have a thickness of equal to or greater or less than 15 μm, 10 μm, 5 μm, 2 μm, or 1 μm.

Figure 6:
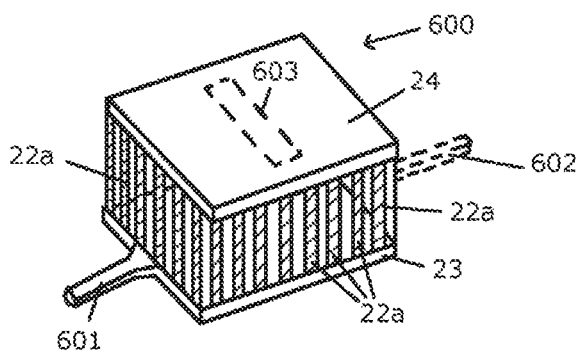
FIG. 6 schematically illustrates a perspective view of an exemplary rectangular waveguide including a row of electrical vias as a waveguide side wall.

Referring to FIG. 6, a rectangular waveguide 600 has an input port 601 and an output port 602. The input port 601 and the output port 602 may be connected to the first metal plate 23. The wall structures 22a may surround a cavity defined between the first and second metal plates 23, 24 and the enclosing wall structures 22a. By way of example, both at the longitudinal side and the transversal side of the rectangular waveguide 600, the wall structures 22a may be formed by conducting vias 22.

The rectangular waveguide 600 may e.g. be a filter, a resonator, or an antenna. In the latter case, the output port 602 may be omitted. Further, one of the metal plates, e.g. the second metal plate 24, may be provided with an opening 603. The opening 603 may act as an antenna to emit microwave radiation from the rectangular waveguide 600. The opening 603 may e.g. have a slit-like shape.

Figure 7:
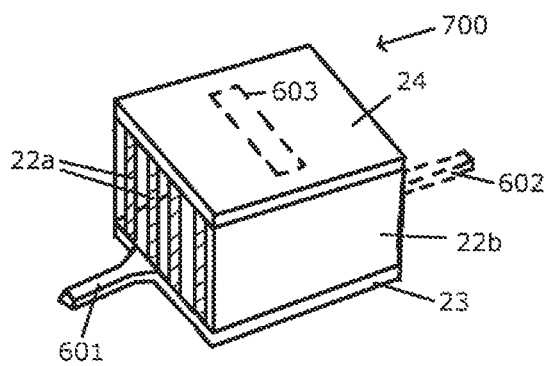
FIG. 7 schematically illustrates a perspective view of an exemplary rectangular waveguide including a row of electrical vias and a closed wall as waveguide side walls.

The microwave component 700 illustrated in FIG. 7 is similar to microwave component 600 of FIG. 6 except that one electrically conducting wall structure is implemented by a continuous wall 22b. In the example shown in FIG. 7, the continuous wall 22b is oriented in the longitudinal direction of the rectangular waveguide 700, while the wall structure in transversal direction may still be implemented by a row of electrically conducting vias 22a. Again, the microwave component 700 may e.g. be configured as a filter, a resonator, or an antenna.

Figure 8:
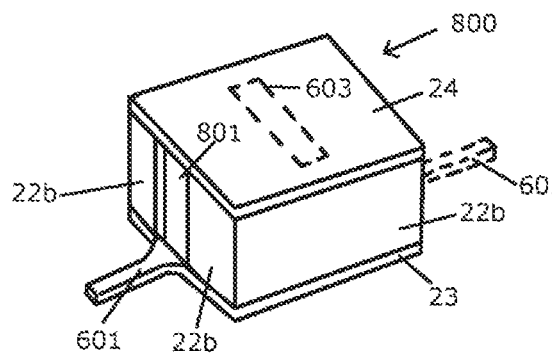
FIG. 8 schematically illustrates a perspective view of an exemplary rectangular waveguide including closed walls (except an input opening) as waveguide side walls.

Referring to FIG. 8, a microwave component 800 may be similar to microwave components 600, 700 except that all of the electrically conducting wall structures may be realized by continuous walls 22b. In this case both the longitudinal and the transversal side walls of the rectangular waveguide 800 may be designed by continuous walls. The transversal wall structures may have an opening 801 adjacent to the input/output microwave ports 601, 602 to allow coupling of the microwave signal into and out of the microwave component 800. Again, microwave component 800 may be a filter, a resonator, or an antenna.

Figure 9A:
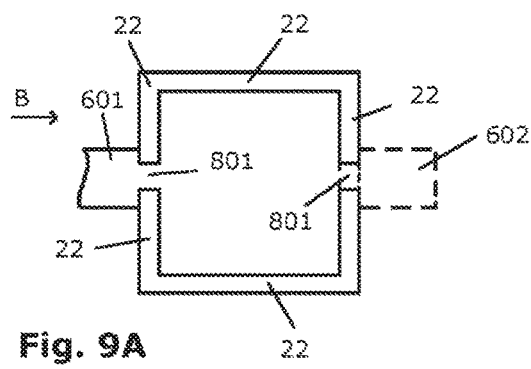
FIGS. 9A and 9B schematically illustrate a plan view and a side view from viewing direction B, respectively, of the exemplary rectangular waveguides shown in FIGS. 6 to 8.
Figure 9B:
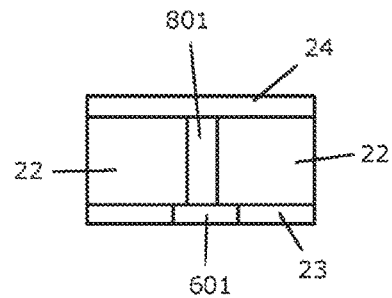

FIG. 9A illustrates a plan view onto the microwave components 600, 700 and 800 when the second metallic plate 24 is removed. As can be seen in FIG. 9A, the electrically conducting wall structures 22 may be shaped in a frame-like structure which completely surrounds the interior of the rectangular waveguide except, e.g., openings 801 at the input microwave port 601 and the output microwave port 602. As described above, the electrically conducting wall structures 22 may, e.g., be formed by rows of vias, slots, or continuous walls. FIG. 9B is a side view from viewing direction B of FIG. 9A.

Figure 10:
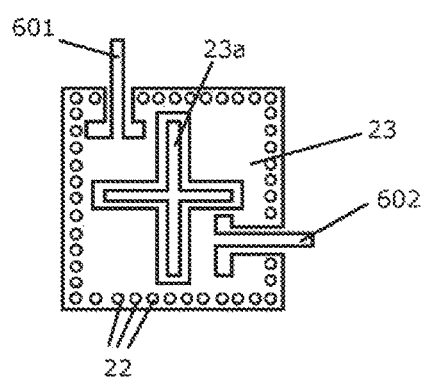
FIG. 10 is a plan view of a first metal plate of an exemplary rectangular waveguide forming, e.g., a filter.

Among the microwave components 20, a variety of different filter, resonator and antenna topologies may be implemented. The filters, resonators or antennas illustrated in FIGS. 6 to 9 are of a simple rectangular waveguide topology. In FIG. 10 a filter, resonator or antenna with a rectangular cavity and a triple-mode resonator is shown. FIG. 10 is a plan view of the first metal plate 23. The first metal plate 23 is structured to have an insular region 23a which is electrically isolated from the residual first metal plate 23. In the example shown in FIG. 10, the insular region 23a has the shape of e.g. two crossed bars. The input microwave port 601 and the output microwave port 602 are provided by stripes of the first metal plate 23 which are separated from the residual metal plate 23 by small gaps or spacings until they reach an inner location of the first metal plate 23. Further, the electrically conducting wall structures are indicated in FIG. 10 by rows of circles (which, e.g., correspond to the rows of vias 22a (i.e. via fence) to form the electrically conducting wall structures 22; however, here and in all other embodiments described herein, the electrically conducting wall structures may also be implemented partly or completely by continuous conducting walls rather than by via fences).

Figure 11:
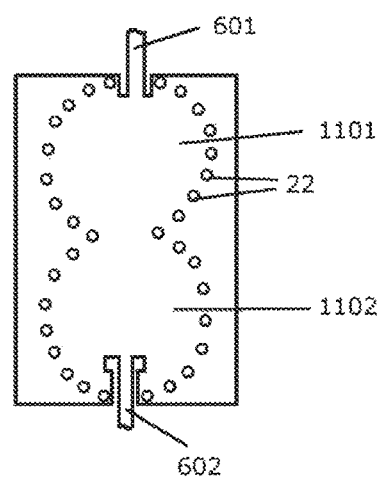
FIG. 11 is a plan view of a first metal plate of an exemplary rectangular waveguide forming, e.g., a filter.

FIG. 11 illustrates another topology of a filter, resonator or antenna made of a rectangular waveguide. Again, a plan view of the first (bottom) metal plate 23 is shown. The rectangular waveguide comprises a plurality of, e.g. two, communicating circular cavities 1101, 1102. The circular cavities 1101, 1102 are defined by the electrically conducting wall structures 22 with the footprints thereof are indicated by circles.

In general, as exemplified by FIGS. 10 and 11, the basic filter/resonator/antenna structures illustrated by way of example in FIGS. 6 to 9 may be modified by the provision of cut outs in the first metal plate 23 or the second metal plate 24 and/or by specifically shaping the outline of the electrically conducting wall structures 22 to provide for specific characteristics of the filters/resonators/antennas.

Figure 12:
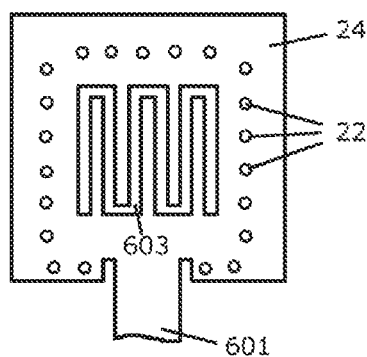
FIG. 12 is a plan view of a second metal plate of an exemplary rectangular waveguide forming, e.g., an antenna.

FIG. 12 illustrates a plan view on e.g. the second metal plate 24 of an antenna. The opening 603 may have a zig-zag or meander-like shape. The outline of the electrically conducting wall structures 22 is, again, indicated by circles. The electrically conducting wall structures 22 may enclose the antenna opening 603 to all sides to define a rectangular waveguide structure. As shown in FIG. 12, an input 601 of this rectangular waveguide structure may (also) be implemented at the (top) second metal plate 24. In this case, the electrical interconnect 40 configured to electrically couple the microwave signal into the microwave component 20 may, e.g., be provided by the electrically conducting layer 60 rather than, e.g., by the electrical redistribution structure 50. The concept of having input/output microwave ports 601, 602 coupled to the second metal plate 24 may be applied to all implementations illustrated herein.

It is to be noted that the semiconductor device packages described herein may include a plurality of microwave components 20. By way of example, a semiconductor device package may include an array of filter, resonator, or antenna microwave components. In this case, a semiconductor device package may contain a semiconductor chip and a filter array, resonator array, or antenna array.

Figure 13:
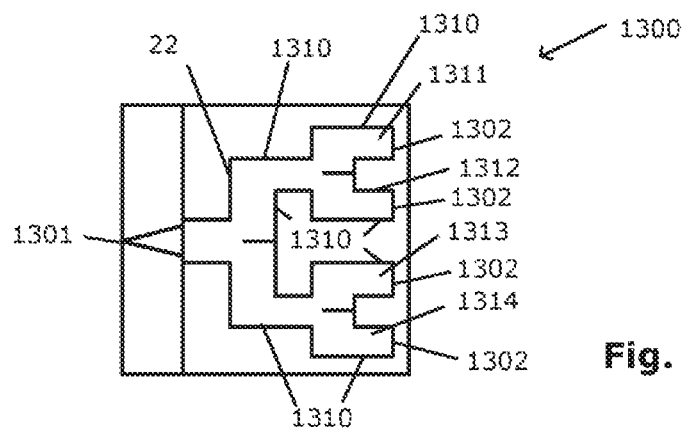
FIG. 13 is a plan view of a first metal plate of an exemplary rectangular waveguide forming, e.g., a power combiner or power divider.

Referring to FIG. 13, an exemplary, schematic illustration of a microwave coupler, e.g. power combiner and/or power divider 1300 is shown. An input/output port 1301 communicates with a rectangular waveguide cavity defined by wall structures 22 indicated here by lines 1310. Starting from the input/output microwave port 1301, the cavity defined by the electrically conducting wall structures splits in two and, thereafter, in four branches 1311, 1312, 1313, 1314. Each of these branches 1311, 1312, 1313, 1314 communicate with an individual input/output microwave port 1302.

If port 1301 is used as an input port and ports 1302 are used as output ports, the rectangular waveguide coupler illustrated in FIG. 13 works as a power divider. If ports 1302 are used as input ports and port 1301 is used as an output port, the rectangular waveguide coupler shown in FIG. 13 works as a power combiner.

Figure 14:
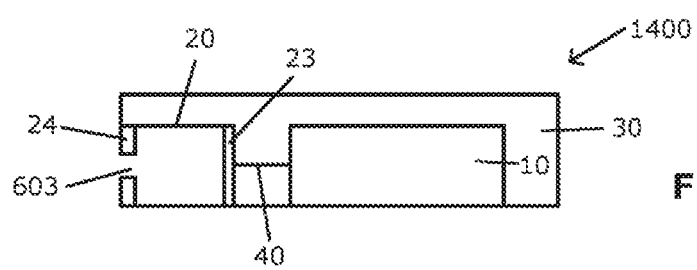
FIG. 14 schematically illustrates a cross-sectional view of an exemplary semiconductor device package including a semiconductor chip and a rectangular waveguide including an antenna radiating in a lateral direction.

FIG. 14 illustrates an exemplary semiconductor device package 1400. The semiconductor device package 1400 is similar to, e.g., semiconductor device package 100 of FIG. 1, and reference is made to the corresponding disclosure in order to avoid reiteration. However, in addition to the corresponding disclosure in conjunction with FIG. 14, the microwave component 20 is configured as an antenna which has a main direction of radiation oriented in a direction parallel to the direction of the first and/or second main surfaces 30a, 100a, 30b, or 100b of the encapsulant 30 and/or the semiconductor device package 100, respectively. By way of example, the microwave component 20 may be a rectangular waveguide similar to the rectangular waveguides illustrated in FIGS. 1 to 4 and 5 to 12. However, the opening 603 of the rectangular waveguide 20 may be arranged at a side face of the semiconductor device package 1400. In other words, the microwave component 20 may correspond to any of the microwave components 20 described before with the exception that the microwave component 20 of FIG. 14 is rotated by 90° with respect to the microwave components 20 described herein before. As a consequence the first metal plate 23 may face towards a side face of the semiconductor chip 10, while the second metal plate 24 may face towards a side face of the semiconductor device package 1400 and may, e.g., be exposed at this side face.

Figure 15:
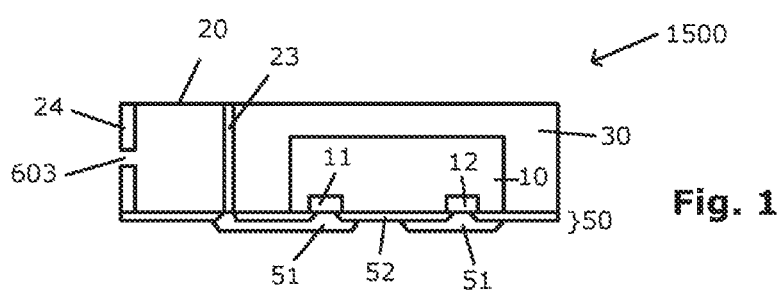
FIG. 15 schematically illustrates a cross-sectional view of an exemplary semiconductor device package including a semiconductor chip, a rectangular waveguide including an antenna radiating in a lateral direction and an electrical redistribution layer (RDL).

Referring to FIG. 15, a semiconductor device package 1500 may be designed similar to the semiconductor package 300 of FIG. 3, and reference is made to the above description to avoid reiteration. However, the same way as described in conjunction with FIG. 14, the microwave component 20 is rotated by 90° relative to the orientation of the microwave component 20 of FIG. 3. The microwave component 20 may be an antenna having an opening 603 at a side face of the semiconductor device package 1500 as described above. In FIG. 15, by way of example, the semiconductor device package 1500 is equipped with an electrical redistribution structure 50 as an electrical interconnect 40.

It is to be noted that specific features which have been described in an exemplary fashion by utilizing one of the semiconductor device packages of FIGS. 1 to 15 could also be employed in other of these packages and combined with any other specific feature described herein if not explicitly excluded by the description.

FIG. 16A illustrates a plan view of a coplanar microwave transmission line (CTL). A CTL comprises one central conductor 1601 and a pair of return conductors 1602 arranged to both sides of the central conductor 1601. A CTL may be fabricated in one conductor plane, e.g. by using one structured metallization layer.

FIG. 16B illustrates a sectional view of an example of a micro strip transmission line. As already mentioned, a microstrip transmission line comprises a conductor trace 1610 arranged over an insulating layer 1611. The insulating layer 1611 is arranged over an electrically conducting base layer 1612. The micro-strip transmission line requires at least two distinct metal layers, i.e. is a non-planar structure, which may be implemented in a multi-layer redistribution structure 50.

Referring to FIG. 17, a semiconductor device package as described herein may be fabricated using e.g. an eWLP (embedded wafer level packaging) technology. At S1 a plurality of semiconductor chips may be placed on a temporary carrier. As will be described further below in more detail, pre-fabricated microwave components 20 and/or other components such as passives (e.g. resistors, inductors, capacitors) may be placed on the temporary carrier. A passive may, e.g., be provided by a semiconductor chip which is designed as a passive component, a so-called PID (passive integrated device).

At S2 the plurality of semiconductor chips (and, if present, also the microwave component(s) 20 and, e.g., other components as mentioned above) are covered with an encapsulation material to form an encapsulation body.

At S3 a plurality of microwave components 20, each comprising at least one electrically conducting wall structure 22, is integrated in the encapsulation body. S3 may be performed in parallel with S2, if pre-fabricated inserts, containing the microwave components 20, are used. Further, it is possible to create the microwave components 20 only after the encapsulation body has been formed. As will be described in more detail further below, planar techniques such as laser-drilling, micro-drilling, laser ablation, metal deposition (e.g. electroless or galvanic plating, printing, etc.) may be used to fabricate the microwave components 20.

At S4 a plurality of electrical interconnects, each configured to electrically couple a semiconductor chip and a microwave component, is formed. By way of example, S4 may be performed in parallel with S2 and S3, if the electrical interconnects are embedded within the encapsulation material. If the electrical interconnects are formed by means of an electrical redistribution structure 50 or another metallization, e.g. metallization layer 60, S4 may be performed prior to or after S3.

At S5 the encapsulation body is separated into single semiconductor device packages each comprising a semiconductor chip, a microwave component and an electrical interconnect. Separating the encapsulating body to produce the encapsulants of the semiconductor device packages may be formed by dicing, mechanical sawing, laser cutting, etching, etc.

FIGS. 18A-18F illustrate an exemplary eWLP process to fabricate semiconductor device packages, e.g. semiconductor device packages as shown in FIG. 4.

Figure 18A:
FIGS. 18A to 18F schematically illustrate one exemplary embodiment of a method to manufacture semiconductor device package including a semiconductor chip and a microwave component by using embedded wafer level packaging (eWLP) technology FIGS. 19A to 19D schematically illustrate one exemplary embodiment of a method to manufacture semiconductor device package including a semiconductor chip and a microwave component by using embedded wafer level packaging (eWLP) technology

Referring to FIG. 18A, a temporary carrier 1601 is provided.

Figure 18B:
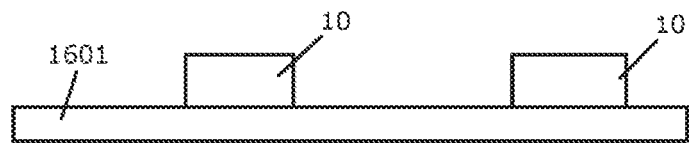

Referring to FIG. 18B, a plurality of semiconductor chips 10, e.g. of same kind or of different kinds, is placed in a spaced-apart relationship on the temporary carrier 1601. The semiconductor chips 10 are secured to the temporary carrier 1601 by, e.g., the application of an adhesive, e.g. a sticky tape (not shown). Several tens or hundreds of semiconductor chips 10 may be placed on the temporary carrier, i.e. FIGS. 18A to 18F merely illustrate a partial view of the entire arrangement.

Figure 18C:
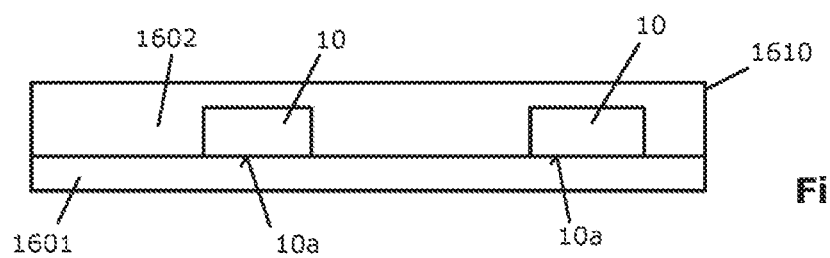

In FIG. 18C the encapsulation material 1602 is applied over the temporary carrier 1601 and the semiconductor chips 10. The encapsulating material 1602 may completely cover the semiconductor chips 10 except of their first main surfaces 10a.

The encapsulating material 1602 may be a laminate material or a mold material. After hardening or curing the encapsulating material 1602 becomes rigid and provides stability to the embedded array of semiconductor chips 10, which is referred to as an encapsulation body 1610 (or "artificial wafer" or "reconfigured wafer") herein. A small thickness of the encapsulation body 1610 and/or a partial or complete exposure of the second main surfaces 10*b* of the semiconductor chips 10 may be obtained by optional grinding or lapping of the encapsulation body 1610 or by other methods.

Figure 18D:
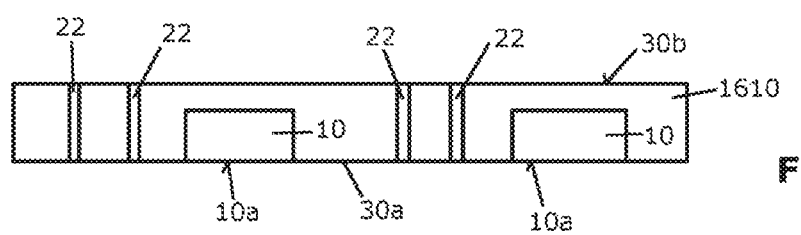

In FIG. 18D the encapsulation body 1610 has been released from the temporary carrier 1601. To this end, the adhesive or sticky tape (not shown) may feature, e.g., thermo-release or UV-release properties. The first main surface 100*a* of the encapsulation body 1610 may be a plane, i.e. the first (e.g. active) main surfaces 10*a* of the semiconductor chips 10 may level with the first main surfaces 30*a* of the encapsulation body 1610. As already mentioned, chip electrodes may be exposed at the first main surfaces 10*a* of the semiconductor chips 10.

Further to FIG. 18D, electrically conducting wall structures 22 of microwave components 20 may be introduced into the (hardened) encapsulation body 1610. The electrically conducting side wall structures 22 may have any design, shape, and arrangement as described above. The electrically conducting side wall structures may, e.g., form 3D elements of rectangular waveguides or of electromagnetic shieldings.

Figure 18E:
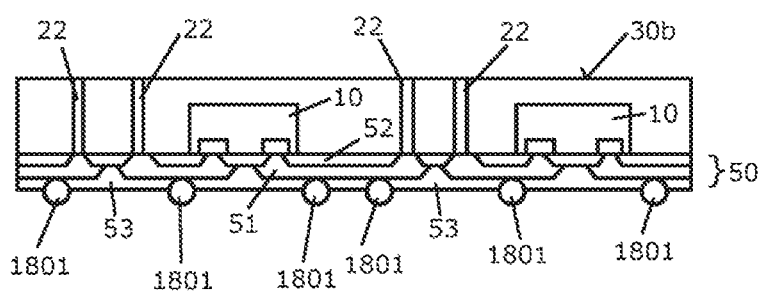

Referring to FIG. 18E, the electrical redistribution structure 50 may be formed over the common plane composed of, e.g., the first main surfaces 10*a* of the semiconductor chips 10 and the first main surface 30*a* of the encapsulation body 1610.

The electrical redistribution structure 50, as exemplarily illustrated in FIG. 18E, may be provided with an outermost dielectric layer 53. The dielectric layer 53 may form a so-called solder stop layer. That is, the dielectric layer 53 may have openings that define the locations at which solder deposits 1801 are to be attached. The solder deposits 1801 represent external terminals of the semiconductor device packages to be manufactured. The external terminals are intended to be connected to external circuitry, e.g. application boards on which the semiconductor device packages are to be mounted.

The dielectric layers 52, 53 and the metallization layer(s) 51 may be manufactured in thin-film technology using photolithographic structuring techniques. Each of these structuring processes may, e.g., be performed on the entire encapsulation body 1610 (i.e. on "reconfigured wafer" level), e.g. by exposing the entire encapsulation body 1610 by a global mask or reticle process rather than by exposing each single semiconductor device packages individually by a mask process in a sequential manner. Further, the so-called ball attach process, i.e. the application of solder deposits 1801, may also be performed on the entire (integral) encapsulation body 1610.

Figure 18F:
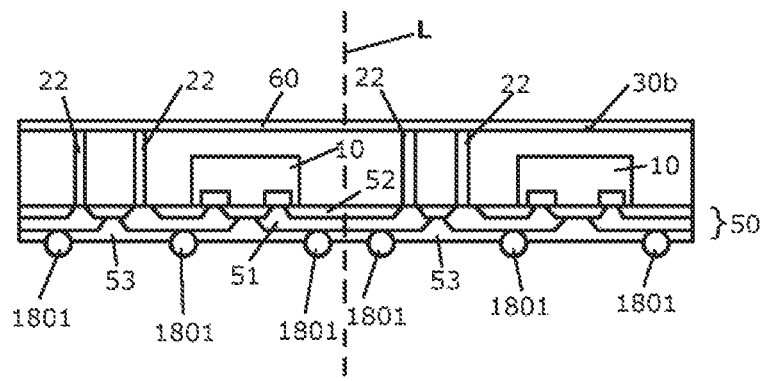

Referring to FIG. 18F, the electrically conducting layer 60 may be applied to the second main surface 30*b* encapsulation body 1602. The metal layer 60 may be applied over the encapsulation body 1602 by various techniques. By way of example, the metal layer 60 may be deposited over or on the encapsulation body 1602 by a CVD (chemical vapor deposition) process, a PVD (physical vapor deposition) process, spraying, printing, a plasma beam process, galvanic or electroless deposition, or sputtering.

The process of singulating the encapsulation body 1610 into single semiconductor device packages may be performed by cutting the encapsulation body 1610 along cutting lines L indicated in FIG. 18F by dashed lines.

Figure 19A:
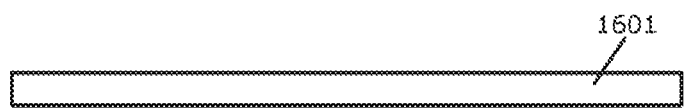

FIGS. 19A to 19D illustrate an exemplary method of producing semiconductor device packages in accordance with the above description. In FIG. 19A a temporary carrier 1601 is provided (compare to FIG. 18A).

Figure 19B:
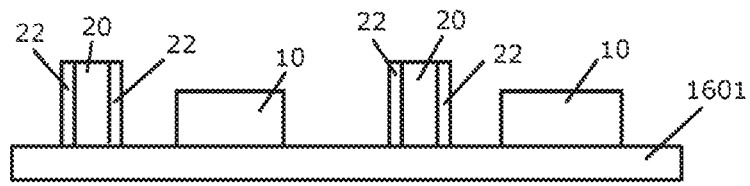

In FIG. 19B microwave components 20 are additionally placed onto the temporary carrier 1601. The microwave components 20 and the semiconductor chips 10 may be arranged in an alternating order. The microwave components 20 may be implemented as pre-fabricated inserts in accordance with the previous description.

The inserts themselves may be produced by, e.g., coating a plastic plate or a laminate at its top surface and at its bottom surface with metal layers. The double-side metal coated plastic plate or laminate may then be separated, e.g. cut, sawn, etc., into a plurality of pieces. These pieces with two metal-coated surfaces may then be used as inserts, whereby the metal-coated surfaces may e.g. provide for (continuous) electrically conducting wall structures 22 of the microwave components 20. According to another mode of fabrication, the two metal-coated surfaces of the laminate or plastic plate pieces may provide for the first and second metal plates 23, 24, while electrically conducting wall structures 22 (e.g. via fences, via bars) had been generated in the plastic plate or laminate before separating it into the plurality of pieces. The electrically conducting wall structures 22 may be introduced into the plastic plate or the laminate before or after the plastic plate or laminate was coated with the metal layers. Further, the same processes, designs, dimensions, functions, etc. as described herein in conjunction with the implementation of microwave components directly in the encapsulant may be applied to the plastic plate or the laminate to produce the pieces (inserts). The plastic plate or laminate may comprise or be of one of the materials mentioned herein as encapsulation material. In particular, the plastic plate or laminate may, e.g., be of the encapsulation material used hereinafter for package encapsulation.

Figure 19C:
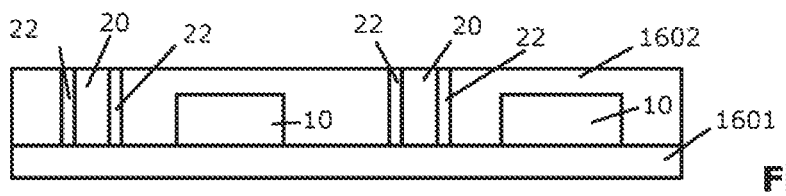

Referring to FIG. 19C, the encapsulating material 1602 is applied over the temporary carrier 1601, the semiconductor chips 10 and the microwave components 20. Reference is made to the previous description in conjunction with FIG. 18C in order to avoid reiteration.

Figure 19D:
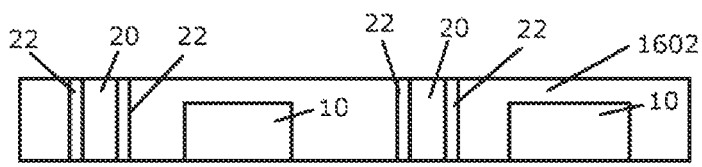

FIG. 19D illustrates the encapsulation body 1910 when being released from the temporary carrier 1601. This and all further processes may be performed the same way as described with reference to FIGS. 18D to 18F.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing an array of semiconductor device packages, the method comprising:
    placing a plurality of semiconductor chips on a temporary carrier;
    covering the plurality of semiconductor chips with an encapsulation material to form an encapsulation body;
    providing a plurality of microwave components each comprising at least one electrically conducting wall structure integrated in the encapsulation body;
    forming a plurality of electrical interconnects each configured to electrically couple a semiconductor chip and a microwave component; and separating the encapsulation body into single semiconductor device packages each comprising a semiconductor chip, a microwave component, and an electrical interconnect.

2. The method of claim 1, wherein forming the plurality of electrical interconnects comprises:

forming a metallization layer over a first main surface of the encapsulation body; and structuring the metallization layer to form microwave transmission lines.

3. The method of claim 1, further comprising:

forming a metallization layer over a first main surface of the encapsulation body; and structuring the metallization layer to form first plates of rectangular waveguides.

4. The method of claim 1, wherein providing the plurality of microwave components integrated in the encapsulation body comprises:

forming rows of conducting vias or conducting slots in the encapsulation body to form the plurality of electrically conducting wall structures in the encapsulation body.

5. The method of claim 1, wherein providing the plurality of microwave components integrated in the encapsulation body comprises:

placing a plurality of inserts each comprising at least one microwave component on the temporary carrier; and covering the plurality of inserts with the encapsulation material.

6. The method of claim 5, wherein the electrically conducting wall structure comprises a metallization on a wall of the insert.

7. The method of claim 1, further comprising:

forming an electrically conducting layer over a second main surface of the encapsulation body; and structuring the electrically conducting layer to form second plates of rectangular waveguides.

\* \* \* \* \*